US012751276B2

(12) United States Patent
Mazza et al.

(10) Patent No.: US 12,751,276 B2
(45) Date of Patent: Sep. 29, 2026

(54) INTERCONNECT STRUCTURE WITH INTRA-LEVEL METAL LINE CONNECTORS

(71) Applicant: International Business Machines Corporation, Armonk, NY (US)

(72) Inventors: James P Mazza, Saratoga Springs, NY (US); Nicholas Anthony Lanzillo, Wynantskill, NY (US); Reinaldo Vega, Mahopac, NY (US); David Wolpert, Poughkeepsie, NY (US); Takashi Ando, Eastchester, NY (US)

(73) Assignee: International Business Machines Corporation, Armonk, NY (US)

( * ) Notice: Subject to any disclaimer, the term of this patent is extended or adjusted under 35 U.S.C. 154(b) by 319 days.

(21) Appl. No.: 18/603,487

(22) Filed: Mar. 13, 2024

(65) Prior Publication Data

US 2025/0293145 A1 Sep. 18, 2025

(51) Int. Cl.
*H10W 20/43* (2026.01)
*H10W 20/00* (2026.01)
*H10W 20/41* (2026.01)

(52) U.S. Cl.
CPC ....... *H10W 20/432* (2026.01); *H10W 20/081* (2026.01); *H10W 20/435* (2026.01); *H10W 20/063* (2026.01)

(58) Field of Classification Search
None
See application file for complete search history.

(56) References Cited

U.S. PATENT DOCUMENTS

| | | | | |
|---|---|---|---|---|
| 5,289,423 | A | 2/1994 | Natale | |
| 5,768,174 | A | 6/1998 | Seo et al. | |
| 6,287,979 | B1 * | 9/2001 | Zhou | B82Y 10/00 438/743 |
| 10,163,690 | B2 | 12/2018 | Wu | |
| 10,256,186 | B2 | 4/2019 | Bonilla | |
| 10,522,402 | B2 | 12/2019 | Guler | |
| 10,950,547 | B2 | 3/2021 | Mohammed | |
| 11,139,241 | B2 | 10/2021 | Morrow | |
| 11,444,024 | B2 | 9/2022 | Lin | |
| 12,564,043 | B2 | 2/2026 | Chiu et al. | |
| 2010/0072629 | A1 | 3/2010 | Lee | |

(Continued)

FOREIGN PATENT DOCUMENTS

| | | | |
|---|---|---|---|
| EP | 0487468 | B1 | 8/1996 |
| WO | 2017/111926 | A1 | 6/2017 |

OTHER PUBLICATIONS

List of IBM Patents or Patent Applications Treated as Related, 2 pages.

(Continued)

*Primary Examiner* — Bilkis Jahan
(74) *Attorney, Agent, or Firm* — Aaron N. Pontikos

(57) ABSTRACT

A semiconductor interconnect structure and formation thereof. The semiconductor interconnect structure includes a first metal line, a second metal line, and a third metal line running along a first orientation within a metal level, where the second metal line is located between the first and third metal lines. The semiconductor interconnect structure further includes a metal line connector running along a second orientation within the metal level. The metal line connector is located below the second metal line, and connected to the first and third metal lines.

16 Claims, 9 Drawing Sheets

(56) References Cited

U.S. PATENT DOCUMENTS

| | | | | |
|---|---|---|---|---|
| 2013/0181338 | A1* | 7/2013 | Lu | H10W 74/131<br>257/737 |
| 2018/0033691 | A1* | 2/2018 | You | H10W 20/056 |
| 2018/0108611 | A1 | 4/2018 | Wu et al. | |
| 2020/0203358 | A1 | 6/2020 | Avci et al. | |
| 2021/0098368 | A1 | 4/2021 | Yu et al. | |
| 2023/0118565 | A1 | 4/2023 | Fu et al. | |
| 2023/0369107 | A1 | 11/2023 | Lai et al. | |
| 2024/0047341 | A1 | 2/2024 | Xie et al. | |
| 2024/0074329 | A1 | 2/2024 | Lee et al. | |
| 2024/0105267 | A1 | 3/2024 | Kang et al. | |
| 2024/0170395 | A1 | 5/2024 | Lanzillo et al. | |
| 2024/0203868 | A1* | 6/2024 | Singh | H10W 20/057 |
| 2024/0321630 | A1 | 9/2024 | Xie et al. | |
| 2025/0125253 | A1 | 4/2025 | Oh et al. | |
| 2025/0266396 | A1* | 8/2025 | Yeh | H10W 80/00 |
| 2025/0344456 | A1 | 11/2025 | Tsai et al. | |

OTHER PUBLICATIONS

U.S. Appl. No. 18/400,791, filed Dec. 29, 2023 titled “Orthogonal Metal Lines at the Same Metal Level”. A Copy of This Reference is not Attached Because it is Readily Available to the Examiner.

* cited by examiner

INTERCONNECT STRUCTURE WITH INTRA-LEVEL METAL LINE CONNECTORS

BACKGROUND

The present disclosure generally relates to fabrication methods and structures for semiconductor devices, and more specifically, to fabricating a semiconductor interconnect structure having metal lines that are connected to one another in the same metal level.

For an integrated circuit (IC) device to be functional, multi-level or multi-layered interconnection schemes such as, for example, metal wiring formed by additive manufacturing processes (e.g., single damascene processes or dual damascene processes), subtractive manufacturing processes (e.g., subtractive etching processes), and combinations thereof, are fabricated in the back-end-of-the-line (BEOL) of the device to connect the circuit elements distributed in the front-end-of-the-line (FEOL) of the device. Connections between the metal lines of the different interconnect levels, called vias, allow signals and power to be transmitted between one level to the next.

SUMMARY

According to one embodiment of the present invention, a semiconductor interconnect structure is provided. The semiconductor interconnect structure includes a first metal line, a second metal line, and a third metal line running along a first orientation within a metal level, where the second metal line is located between the first and third metal lines. The semiconductor interconnect structure further includes a metal line connector running along a second orientation within the metal level. The semiconductor interconnect structure is located below the second metal line, and connected to the first and third metal lines.

According to another embodiment of the present invention, a semiconductor interconnect structure is provided. The semiconductor interconnect structure includes a first metal line, a second metal line, and a third metal line running along a first orientation within a metal level, where the second metal line is located between the first and third metal lines. The semiconductor interconnect structure further includes a metal line connector running along a second orientation within the metal level. The semiconductor interconnect structure is located above the second metal line, and connected to the first and third metal lines.

According to another embodiment of the present invention, a method of forming a semiconductor interconnect structure is provided. The method includes depositing a first conductive metal material onto a substrate. The method further includes patterning, using subtractive etching, the first conductive metal material to form a first metal line, a second metal line, and a metal line connector connected to the first and second metal lines, where patterning the first conductive metal layer further results in the formation of an opening located between the first and second metal lines that exposes the metal line connector. The method further includes filling the opening with an insulating material. The method further includes etching the insulating material to form a line opening with the insulating material, where the line opening partially extends through the insulating material. The method further includes filling the line opening with a second conductive metal material to form a third metal line above the metal line connector.

DETAILED DESCRIPTION

Figure 1A:
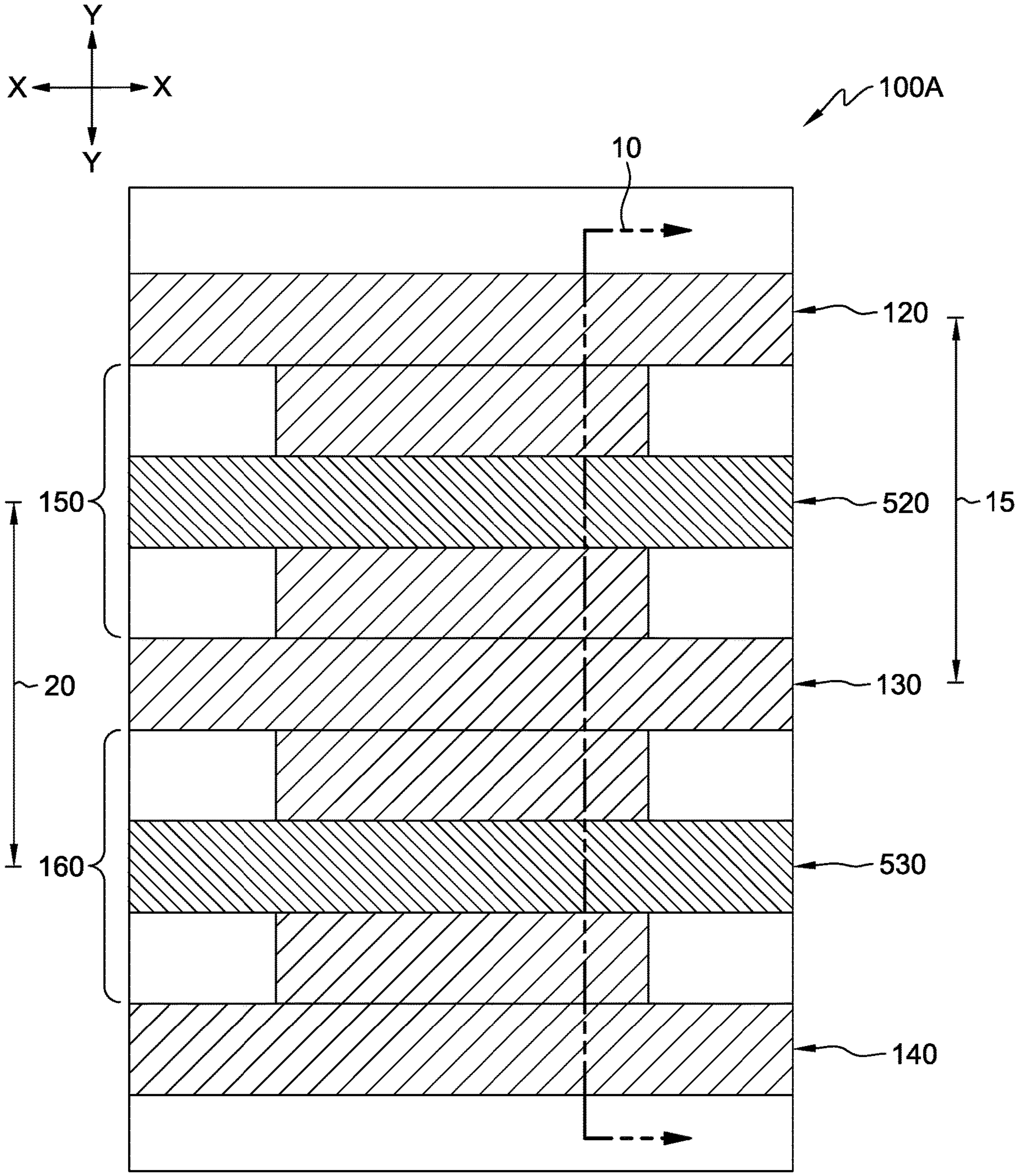
FIG. 1A illustrates a top view of a semiconductor interconnect structure, generally designated 100A, in accordance with at least one embodiment of the present invention.

In conventional interconnect schemes, connections between the metal lines of the different interconnect levels, called vias, allow signals and power to be transmitted between one level to the next. Typically, the direction that the metal lines run along alternates between metal levels. In some cases, two or more metal lines formed in a same metal level need to be connected to one another. For example, two lower-level metal lines (running parallel to one another) may be connected through an upper-level metal line (running perpendicular to the lower-level metal lines), in which individual via connections are made between the lower-level metal lines and the upper-level metal line. Similarly, two upper-level metal lines (running parallel to one another) may be connected through a lower-level metal line (running perpendicular to the upper-level metal lines), in which individual via connections are made between the upper-level metal lines and the lower-level metal line. Thus, at least two metal levels, and possibly more depending on routing congestion, are ultimately required to transfer signals and power between two lines formed in the same metal level.

In other cases, signals and power may simply need to be transferred in direction that is perpendicular to the direction that a metal line runs along. For example, a first metal line formed in a lower metal level may run along a first direction (e.g., along a longitudinal direction). In order to route signals and power from the first metal line in a second direction (e.g., along a latitudinal direction), a second metal line running along the second direction can be formed in an upper metal level, and the first and second metal lines connected by a via. Thus, at least two metal levels, and possibly more depending on routing congestion, are ultimately required to transfer signals and power in a direction that is perpendicular to the direction that a metal line runs along.

Embodiments of the present invention improve upon the foregoing deficiencies of conventional interconnect schemes by providing methods of forming interconnect structures, and the interconnect structures formed as a result thereof, that allow for signals and power to be routed bi-directionally (i.e., in a first direction that the metal lines run along, and in a second direction that is perpendicular to the first direction from which the metal lines run along) within a single metal level.

According to one embodiment of the present invention, a semiconductor interconnect structure is provided. The semiconductor interconnect structure includes a first metal line, a second metal line, and a third metal line running along a first orientation within a metal level, where the second metal line is located between the first and third metal lines. The semiconductor interconnect structure further includes a metal line connector running along a second orientation within the metal level. The metal line connector is located below the second metal line, and connected to the first and third metal lines.

One technical advantage realized by the semiconductor interconnect structure of the present invention is the ability to route signals and power bi-directionally within a single metal level. Another technical advantage realized by the interconnect structure of the present invention is a reduction in the height of the interconnect stack. Since the intra-level metal line connector eliminates the need for multiple metal levels to connect metal lines formed within the same metal level or route signals and power in a direction that is perpendicular to the direction that a metal line runs along, fewer metal levels and via levels are required, which results in a shorter, and more compact, interconnect stack.

In an embodiment, the semiconductor interconnect structure further includes an insulating material that isolates the second metal line from the first metal line, the third metal line, and the metal line connector. This results in a technical effect of the second metal line being electrically insulated form the first metal line, the third metal line, and the metal line connector.

In an embodiment, the second orientation is orthogonal to the first orientation.

In an embodiment, the first metal line, the third metal line, and the metal line connector are formed using a subtractive manufacturing process, and the second metal line is formed using an additive manufacturing process.

In an embodiment, the first metal line and the third metal line are subtractively etched metal lines, and the second metal line is a damascene metal line.

In an embodiment, a bottom surface of the metal line connector is substantially coplanar with a bottom surface of the first and third metal lines, and a top surface of the metal line connector is located below a top surface of the first and third metal lines.

In an embodiment, a top surface of the second metal line is substantially coplanar with a top surface of the first and third metal lines, and a bottom surface of the second metal line is located above a top surface of the metal line connector.

In an embodiment, a first height of the first and third metal lines is greater than a second height of the second metal line.

According to another embodiment of the present invention, a semiconductor interconnect structure is provided. The semiconductor interconnect structure includes a first metal line, a second metal line, and a third metal line running along a first orientation within a metal level, where the second metal line is located between the first and third metal lines. The semiconductor interconnect structure further includes a metal line connector running along a second orientation within the metal level. The metal line connector is located above the second metal line, and connected to the first and third metal lines.

One technical advantage realized by the semiconductor interconnect structure of the present invention is the ability to route signals and power bi-directionally within a single metal level. Another technical advantage realized by the interconnect structure of the present invention is a reduction in the height of the interconnect stack. Since the intra-level metal line connector eliminates the need for multiple metal levels to connect metal lines formed within the same metal level or route signals and power in a direction that is perpendicular to the direction that a metal line runs along, fewer metal levels and via levels are required, which results in a shorter, and more compact, interconnect stack.

In an embodiment, the semiconductor interconnect structure further includes an insulating material that isolates the second metal line from the first metal line, the third metal line, and the metal line connector. This results in a technical effect of the second metal line being electrically insulated form the first metal line, the third metal line, and the metal line connector.

In an embodiment, the second orientation is orthogonal to the first orientation.

In an embodiment, the first metal line, the third metal line, and the metal line connector are formed using an additive manufacturing process, and the second metal line is formed using a subtractive manufacturing process.

In an embodiment, the first metal line and the third metal line are damascene metal lines, and the second metal line is a subtractively etched metal line.

In an embodiment, a top surface of the metal line connector is substantially coplanar with a top surface of the first and third metal lines, and a bottom surface of the metal line connector is located above a bottom surface of the first and third metal lines.

In an embodiment, a bottom surface of the first and third metal lines is substantially coplanar with a bottom surface of second metal line, and a top surface of the second metal line is located below a bottom surface of the metal line connector.

In an embodiment, a first height of the first and third metal lines is greater than a second height of the second metal line.

According to another embodiment of the present invention, a method of forming a semiconductor interconnect structure is provided. The method includes depositing a first conductive metal material onto a substrate. The method further includes patterning, using subtractive etching, the first conductive metal material to form a first metal line, a second metal line, and a metal line connector connected to the first and second metal lines. Patterning the first conductive metal layer further results in the formation of an opening located between the first and second metal lines that exposes the metal line connector. The method further includes filling the opening with an insulating material. The method further includes etching the insulating material to form a line opening within the insulating material, where the line opening partially extends through the insulating material. The method further includes filling the line opening with a second conductive metal material to form a third metal line.

One technical advantage realized by the method of forming the semiconductor interconnect structure of the present invention is the ability to route signals and power bi-directionally within a single metal level. Another technical advantage realized by the method of forming the interconnect structure of the present invention is a reduction in the height of the interconnect stack. Since the intra-level metal line connector eliminates the need for multiple metal levels to connect metal lines formed within the same metal level or route signals and power in a direction that is perpendicular to the direction that a metal line runs along, fewer metal levels and via levels are required, which results in a shorter, and more compact, interconnect stack.

In an embodiment, the first, second, and third metal lines run along a first orientation, and the metal line connector runs along a second orientation that is orthogonal to the first orientation.

In an embodiment, the first metal line, the second metal line, the third metal line, and the metal line connector connected to the first and second metal lines are all formed in a same metal level.

In an embodiment, the third metal line is located above the metal line connector, and between the first and second metal lines.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, terms such as "depositing," "forming," and the like may refer to the disposition of layers, or portions of materials, in accordance with a given embodiment. Such processes may or may not be different than those used in the standard practice of the art of semiconductor device fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, electroplating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, micromachining, microetching, wet and/or dry etching processes, plasma etching processes, or any of the known etching processes in which material is removed.

The present invention will now be described in detail with reference to the Figures. FIGS. 1-11 include various views depicting illustrative steps of methods for manufacturing semiconductor interconnect structures and the resulting semiconductor interconnect structures according to select embodiments of the present invention. One having ordinary skill in the art will appreciate that there are many options available for the formation of the structures described herein and that the following discussion does not limit embodiments to only the techniques described herein.

Figure 1B:
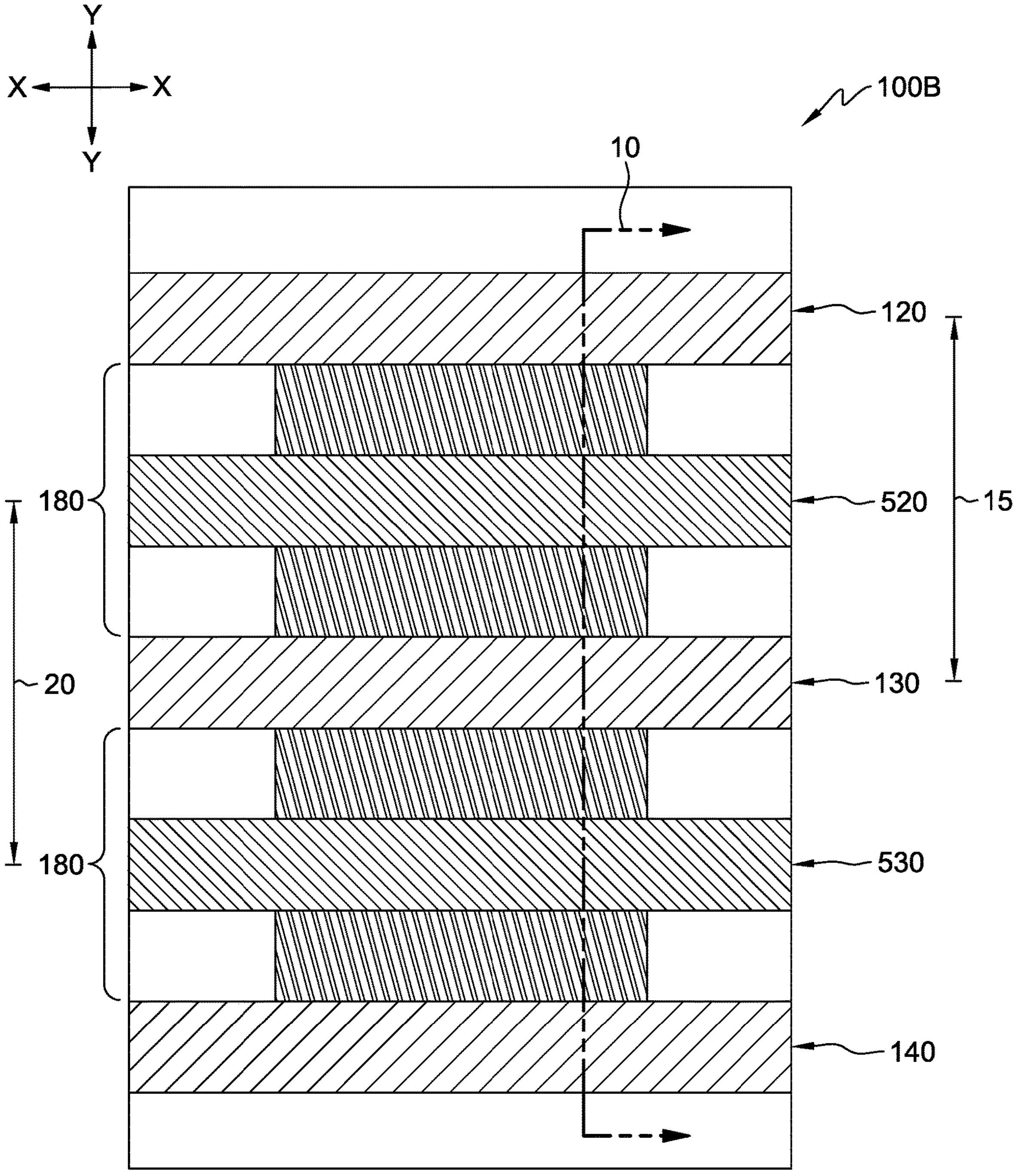
FIG. 1B illustrates a top view of a semiconductor interconnect structure, generally designated 100B, in accordance with at least one embodiment of the present invention.

FIGS. 1A, 1B depict top views of semiconductor interconnect structures, generally designated 100A, 100B in accordance with at least one embodiment of the present invention. For simplicity and ease of understanding, FIGS. 1A, 1B omit some elements and/or layers so as to not obscure the figure. FIG. 1A illustrates a top-down view of locations and relative orientations of a first set of metal lines (i.e., metal lines 120, 130, 140), a second set of metal lines (i.e., metal lines 520, 530), and metal line connectors 150, 160 all formed within a same metal level (e.g., Mx). The first set of metal lines 120, 130, 140 and the second set of metal lines 520, 530 run along a first orientation (i.e., along the direction of line X). Metal line connectors 150, 160 run along a second orientation (i.e., along the direction of line Y) that is perpendicular to the first orientation from which the first and second sets of metal lines run along.

FIG. 1B also illustrates a top-down view of locations and relative orientations of the first set of metal lines (i.e., metal lines 120, 130, 140), the second set of metal lines (i.e., metal lines 520, 530), and metal line connector 180 all formed within a same metal level (e.g., Mx). The first set of metal lines 120, 130, 140 and the second set of metal lines 520, 530 run along a first orientation (i.e., along the direction of line X). Metal line connector 180 runs along a second orientation (i.e., along the direction of line Y) that is perpendicular to the first orientation from which the first and second sets of metal lines run along. It should be appreciated that the first set of metal lines and the second set of metal lines may include any number of metal lines, and that embodiments of the present invention are not limited to the particular number of metal lines as depicted by FIGS. 1A, 1B.

As further depicted by FIGS. 1A, 1B, the metal lines 120, 130, 140 of the first set of metal lines alternate with the metal lines 520, 530 of the second set of metal lines along the direction of line Y. However, in other embodiments, the first set of metal lines and the second set of metal lines need not necessarily alternate between one another. For example, two or more metal lines in the first set of metal lines may be consecutively formed without a metal line from the second set of metal lines formed therebetween. Similarly, two or more metal lines in the second set of metal lines may be consecutively formed without a metal line from the first set of metal lines formed therebetween. In some embodiments, and as depicted by FIGS. 1A, 1B, the first set of metal lines 120, 130, 140 are formed using a subtractive manufacturing process (e.g., subtractive etching), while the second set of metal lines 520, 530 are formed using an additive manufacturing process (e.g., a damascene process). In some embodiments, and as depicted by FIGS. 1A, 1B, a first pitch 15 (i.e., the minimum center-to-center distance) between respective metal lines 120, 130, 140 in the first set of metal lines is equal to a second pitch 20 between respective metal lines 520, 530 in the second set of metal lines. However, in other embodiments, the pitch between respective metal lines 120, 130, 140 in the first set of metal lines may be less than, or greater than, the pitch between respective metal lines 520, 530 in the second set of metal lines.

As further depicted by FIG. 1A, the metal line connector 150 is located below metal line 520 of the second set of metal lines, and is orthogonal to metal lines 120, 130 of the first set of metal lines. The metal line connector 160 is located below metal line 530 of the second set of metal lines, and is orthogonal to metal lines 130, 140 of the first set of metal lines. Thus, it can be said that the metal line connector 150 is perpendicular to metal lines 120, 130 at their respective points of intersection, and that the metal line connector 160 is perpendicular to metal lines 130, 140 at their respective points of intersection. Similarly, and as further depicted by FIG. 1B, the metal line connector 180 is located below metal lines 520, 530, and is orthogonal to metal lines 120, 130, 140 of the first set of metal lines. Thus, it can also be said that the metal line connector 180 is perpendicular to metal lines 120, 130, 140 at their respective points of intersection. Although not depicted by FIG. 1B, metal line connector 180 is also located below metal lines 120, 130, 140 of the first set of metal lines.

The metal line connectors 150, 160, 180 advantageously allow for routing of signals and/or power between metal lines in the same metal level. For example, metal line connector 150 can allow signals and/or power to be routed between metal line 120 and metal line 130 along the direction of line Y. In another example, metal line connector 160 can allow signals and/or power to be routed between metal line 130 and metal line 140 along the direction of line Y. In yet another example, metal line connector 180 can allow signals and/or power to be routed between metal lines 120, 130, 140 along the direction of line Y. Accordingly, signals and/or power can ultimately be routed between multiple metal lines formed in the same metal level, as well as along the individual metal lines themselves.

Figure 2:
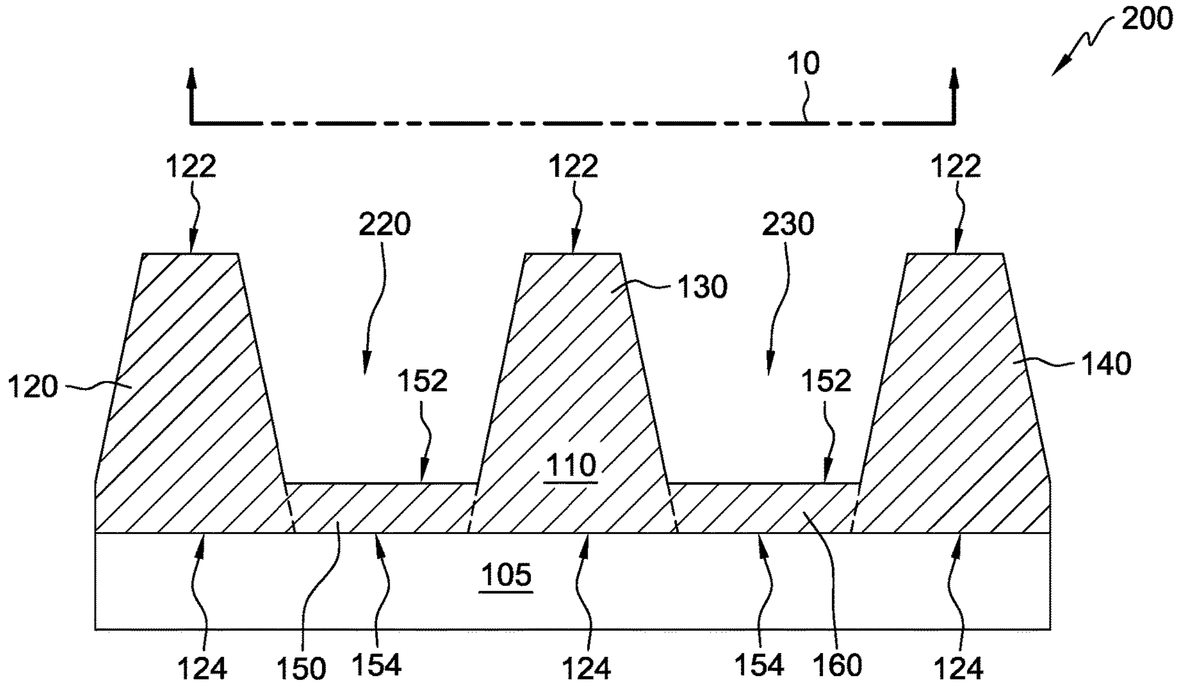
FIG. 2 illustrates a cross-sectional view, taken along corresponding line 10 of FIG. 1A, of an initial semiconductor interconnect structure, generally designated 200, in accordance with at least one embodiment of the present invention.

FIGS. 2-5A illustrate a process flow of forming the semiconductor interconnect structure 100 of FIG. 1. FIG. 2 depicts a cross-sectional view, taken along corresponding line 10 of FIG. 1, of an initial semiconductor structure, generally designated 200, in accordance with at least one embodiment of the present invention. In assembly of semiconductor interconnect structure 200, and referring to the cross-sectional view of FIG. 2 taken along corresponding line 10 of FIG. 1, a first conductive metal material 110 is deposited onto the substrate 105, and patterned, using subtractive etching, to form the first set of metal lines 120, 130, 140 and the metal line connectors 150, 160. The patterning of the first conductive metal material 110 to form the first set of metal lines 120, 130, 140, and the metal line connectors 150, 160 may generally be referred to herein as a subtractive manufacturing process, and the first set of metal lines 120, 130, 140, and the metal line connectors 150, 160 formed as a result thereof may generally be referred to herein as subtractively etched metal lines and subtractively etched metal line connectors, respectively.

In some embodiments, substrate 105 is a bulk semiconductor wafer, such as a bulk silicon (Si), bulk germanium (Ge), bulk silicon germanium (SiGe) and/or bulk III-V semiconductor wafer. Alternatively, in other embodiments, substrate 105 is a semiconductor-on-insulator (SOI) wafer. A SOI wafter includes a SOI layer separated from a substrate by a buried insulator. When the buried insulator is an oxide, it is referred to herein as a buried oxide or BOX. The SOI layer can include any suitable semiconductor, such as Si, Ge, SiGe, and/or a III-V semiconductor.

In some embodiments, substrate 105 may be part of a front-end-of-the-line (FEOL) structure. A FEOL structure is typically present beneath the lowest level of the multilayered interconnect structure and includes a semiconductor substrate having one or more semiconductor devices such as, for example, transistors, capacitors, resistors, and etc. located thereon. In other embodiments, substrate 105 may include one or more interconnect levels of a multilayered interconnect structure, such as a back-end-of-the-line (BEOL) structure. A BEOL structure is typically where the individual semiconductor devices in the FEOL structure are interconnected with one another. In such embodiments, each interconnect level (i.e., metal level) may include one or more electrically conductive structures embedded in an interconnect dielectric material.

The first conductive metal material 110 may be deposited onto the substrate 105 using known deposition techniques including, but not limited to, chemical vapor deposition (CVD), plasma enhanced chemical vapor deposition (PECVD), atomic layer deposition (ALD), physical vapor deposition (PVD), sputtering, chemical solution deposition, or plating. The first conductive metal material 110 may be a metal or metal alloy including, but not limited to, copper (Cu), aluminum (Al), ruthenium (Ru), rhodium (Rh), iridium (Ir), tungsten (W), molybdenum (Mo), nickel (Ni), or an alloy thereof, such as, for example, a Cu—Al alloy.

Following the deposition of the first conductive metal material 110 onto the substrate 105, the first conductive metal material 110 is patterned using a subtractive etching process. For example, a hard mask material (e.g., silicon nitride, titanium nitride, tantalum nitride, or any suitable inorganic metal-containing material) is deposited (e.g., utilizing known techniques including, but not limited to, chemical vapor deposition (CVD), plasma enhanced chemical vapor deposition (PECVD), atomic layer deposition (ALD), physical vapor deposition (PVD), or sputtering) onto the first conductive metal material 110, and the hard mask material is patterned to form a patterned hard mask (not depicted).

By way of example, the patterned hard mask may be formed as follows. A photoresist material (not depicted) is deposited onto the surface of the hard mask material. The photoresist material can be applied by any suitable techniques, including, but not limited to, coating or spin-on techniques. A photomask (not depicted) patterned with shapes defining the patterned structure to be formed is placed over the photoresist material, and the photomask pattern is transferred to the photoresist material using a lithographic process, which creates recesses in the uncovered regions of the photoresist material. The resulting patterned photoresist material is subsequently used to create the same pattern in the hard mask material. Dry etch techniques (for example, an anisotropic etch process, such as reactive ion etch) may be employed to selectively remove portions of the hard mask layer to form the patterned hard mask. After formation of the patterned hard mask, the photoresist material may be stripped from the patterned hard mask by ashing or other suitable processes. The resulting structure may be subjected to a wet clean.

Then, using the patterned hard mask, the first conductive metal material 110 is etched (using, for example, reactive ion etching (RIE), ion beam etching (IBE), chemical wet etching, or a combination of IBE and chemical wet etching) to form the first set of metal lines 120, 130, 140 and the metal line connectors 150, 160.

As depicted by FIG. 2, the patterning of the first conductive metal material 110 further results in the formation of a first set of openings 220, 230 within the first conductive metal material 110 that expose a top surface 152 of the metal line connectors 150, 160. The opening 220 is located between metal lines 120, 130, and extends along the same direction as metal lines 120, 130 (i.e., opening 220 are parallel to metal lines 120, 130). Similarly, the opening 230 is located between metal lines 130, 140, and extends along the same direction as lines 130, 140 (i.e., opening 230 is parallel to metal lines 130, 140). The depth of the openings 220, 230, and thereby the height of the metal line connectors 150, 160, can be controlled by a timed etching process as known by one of ordinary skill in the art.

As further depicted by FIG. 2, the metal line connector 150 is orthogonal to metal lines 120, 130 at their respective points of intersection. Similarly, the metal line connector 160 is orthogonal to metal lines 130, 140 at their respective points of intersection. The bottom surface 154 of the metal line connectors 150, 160 is substantially coplanar with a bottom surface 124 of the first set of metal lines 120, 130, 140, while the top surface 152 of the metal line connectors 150, 160 is substantially below the top surface 122 of the first set of metal lines 120, 130, 140.

Figure 3:
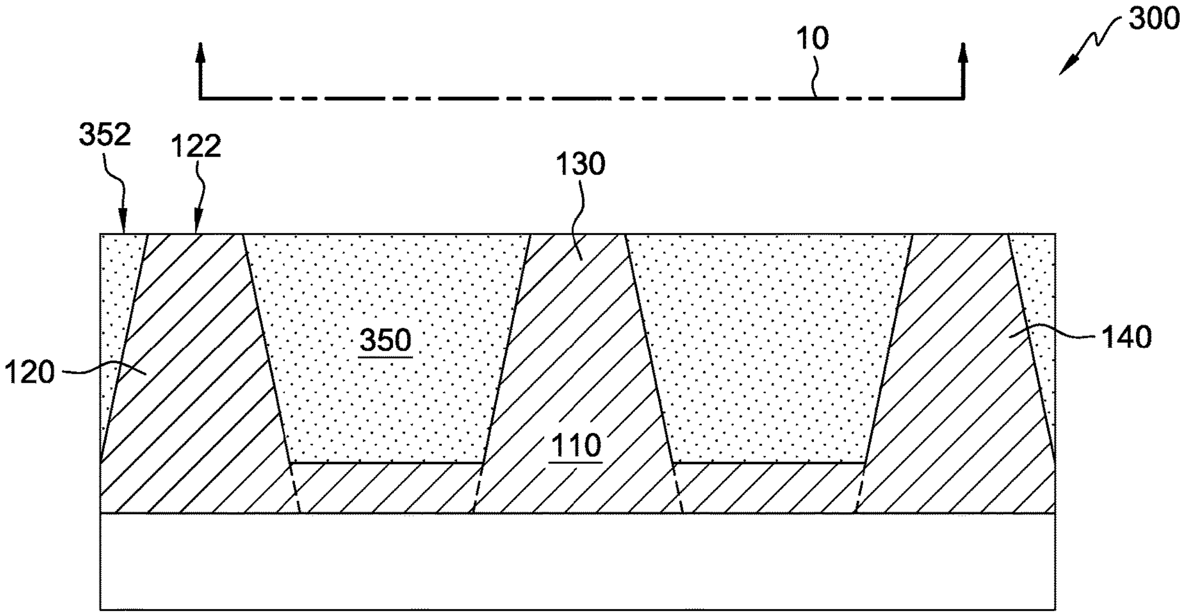
FIG. 3 illustrates a cross-sectional view, taken along corresponding line 10 of FIG. 1A, of semiconductor interconnect structure 200 depicted in FIG. 2 after performing subsequent processing steps, generally designated 300, in accordance with at least one embodiment of the present invention.

FIG. 3 illustrates a cross-sectional view of semiconductor interconnect structure 200 depicted in FIG. 2 after performing subsequent processing steps, generally designated 300, in accordance with at least one embodiment of the present invention. In assembly of semiconductor interconnect structure 300, and referring to the cross-sectional view of FIG. 3 taken along corresponding line 10 of FIG. 1, an insulating material 350 is deposited onto the patterned first conductive metal material 110, followed by a planarization process. As depicted by FIG. 3, the insulating material 350 fills the first set of openings 220, 230 (depicted in FIG. 2) formed within the first conductive metal material 110.

The insulating material 350 may be deposited, using known deposition techniques including, but not limited to, chemical vapor deposition (CVD), plasma enhanced chemical vapor deposition (PECVD), atomic layer deposition (ALD), physical vapor deposition (PVD), sputtering, or chemical solution deposition. In an embodiment, the insulating material 350 is an interlayer dielectric (ILD). The insulating material 350 may be composed of an inorganic dielectric material or an organic dielectric material. In some embodiments, the insulating material 350 may be porous. In other embodiments, the insulating material 350 may be non-porous. In some embodiments, the insulating material 350 may have a dielectric constant (all dielectric constants mentioned herein are measured relative to a vacuum, unless otherwise stated) that is about 4.0 or less. In an embodiment, the insulating material 350 may have a dielectric constant of 2.8 or less. These dielectrics having a dielectric constant of 2.8 or less generally have a lower parasitic cross talk as compared to dielectric materials whose dielectric constant is greater than 4.0. Examples of suitable insulating materials that may be employed as the insulating material 350 include, but are limited to, porous silicates, silicon dioxides, silicon oxynitrides, silicon carbides, silicon nitrides, silicon undoped or doped silicate glass, silsesquioxanes, carbon doped oxides (i.e., organosilicates) that include atoms of Si, C, O and H, and variants thereof, siloxanes, thermosetting polyarylene ethers or any multilayered combination thereof. The term “polyarylene” is used in this present application to denote aryl moieties or inertly substituted aryl moieties which are linked together by bonds, fused rings, or inert linking groups such as, for example, oxygen, sulfur, sulfone, sulfoxide, or carbonyl.

Following the deposition of the insulating material 350 onto the patterned first conductive metal material 110, a planarization process such as, for example, chemical mechanical planarization or polishing (CMP), and/or grinding, may subsequently be performed to remove portions of the insulating material 350 located above the top surface 122 of the first set of metal lines 120, 130, 140. The planarization stops at the top surface 122 of the first set of metal lines 120, 130, 140, such that the top surface 352 of the insulating material 350 is substantially coplanar with the top surface 122 of the first set of metal lines 120, 130, 140.

Figure 4:
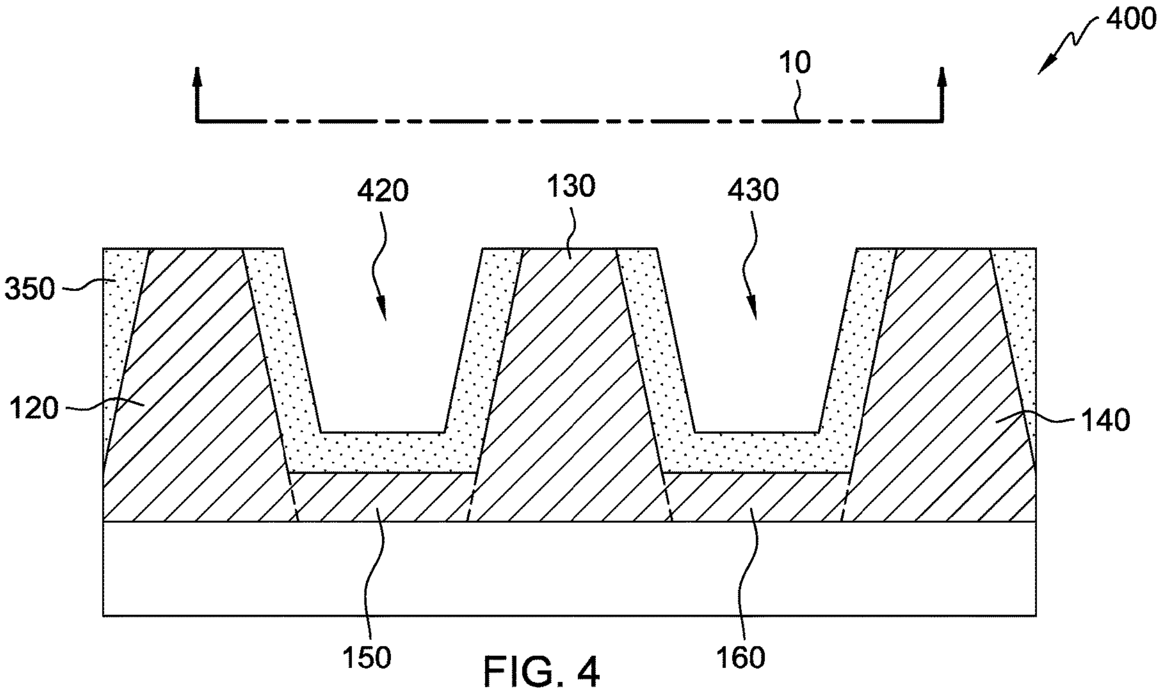
FIG. 4 illustrates a cross-sectional view, taken along corresponding line 10 of FIG. 1A, of semiconductor interconnect structure 300 depicted in FIG. 3 after performing subsequent processing steps, generally designated 400, in accordance with at least one embodiment of the present invention.

FIG. 4 illustrates a cross-sectional view of semiconductor interconnect structure 300 depicted in FIG. 3 after performing subsequent processing steps, generally designated 400, in accordance with at least one embodiment of the present invention. In assembly of semiconductor interconnect structure 400, and referring to the cross-sectional view of FIG. 4 taken along corresponding line 10 of FIG. 1, the insulating material 350 formed between the first set of metal lines 120, 130, 140 is etched to form a first set of line openings 420, 430 within the insulating material 350.

The first set of line openings 420, 430 may be formed as follows. A hard mask material (e.g., silicon nitride, titanium nitride, tantalum nitride, or any suitable inorganic metal-containing material) is deposited (e.g., utilizing known techniques including, but not limited to, chemical vapor deposition (CVD), plasma enhanced chemical vapor deposition (PECVD), atomic layer deposition (ALD), physical vapor deposition (PVD), or sputtering) onto the insulating material 350 and the first set of metal lines 120, 130, 140, and patterned to form a patterned hard mask (not depicted). Then, using the patterned hard mask, the exposed portions of the insulating material 350 formed between metal lines 120 and 130, and between metal lines 130 and 140 is etched (using, for example, reactive ion etching (RIE), ion beam etching (IBE), chemical wet etching, or a combination of IBE and chemical wet etching) to form the first set of line openings 420, 430 within the insulating material 350. The depth of the first set of line openings 420, 430, and thereby the height of metal lines 520, 530 (depicted in FIG. 5) to be formed, can be controlled by a timed etching process as known by one of ordinary skill in the art.

In some embodiments, after forming the first set of line openings 220, 230, an optional metal barrier material is conformally deposited on the exposed surfaces of the line openings 220, 230 to form a barrier layer (not depicted). The barrier layer may include one or more thin layers of material such as, for example, tantalum (Ta), tantalum nitride (TaN), titanium nitride (TiN), hafnium nitride (HfN), cobalt (Co), ruthenium (Ru), tungsten (W), tungsten nitride (WN), titanium-tungsten (TiW), tungsten nitride (WN) manganese (Mn), manganese nitride (MnN) or other barrier materials (or combinations of barrier materials) such as RuTaN, Ta/TaN, CoWP, NiMoP, or NiMoB which are suitable for the given application. The thin metal barrier serves as a barrier diffusion layer and adhesion layer. A conformal layer of a metal barrier material may be deposited using known techniques including, but not limited to, chemical vapor deposition (CVD), plasma enhanced chemical vapor deposition (PECVD), atomic layer deposition (ALD), physical vapor deposition (PVD), sputtering, chemical solution deposition or plating. The thickness of barrier layer may vary depending on the deposition process used, as well as the material employed.

As depicted by FIG. 4, line opening 420 is located between metal lines 120, 130 of the first set of lines, and runs along the same direction as metal lines 120, 130 (i.e., line opening 420 is parallel to metal lines 120, 130). Similarly, line opening 430 is located between metal lines 130, 140 of the first set of metal lines, and runs along the same direction as metal lines 130, 140 (i.e., line opening 430 is parallel to metal lines 130, 140).

Figure 5A:
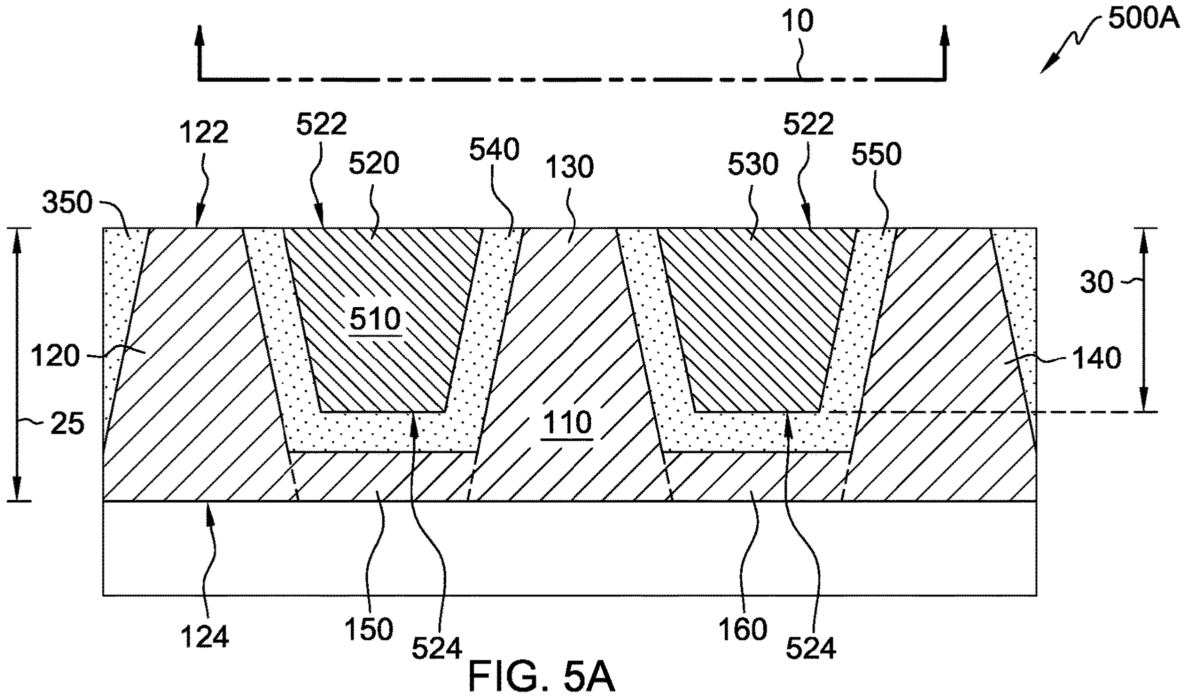
FIG. 5A illustrates a cross-sectional view, taken along corresponding line 10 of FIG. 1A, of semiconductor interconnect structure 400 of FIG. 4 after performing subsequent processing steps, generally designated 500A, in accordance with at least one embodiment of the present invention.

FIG. 5A illustrates a cross-sectional view of semiconductor interconnect structure 400 depicted in FIG. 4 after performing subsequent processing steps, generally designated 500A, in accordance with at least one embodiment of the present invention. In assembly of semiconductor interconnect structure 500A, and referring to the cross-sectional view of FIG. 5 taken along corresponding line 10 of FIG. 1, a second conductive metal material 510 is deposited to fill the first set of line openings 420, 430 (depicted in FIG. 4), followed by a planarization process. The filling of the first set of line openings 420, 430 with the second conductive metal material 510 to form the second set of metal lines 520, 530 may generally be referred to herein as an additive manufacturing process, and the second set of metal lines 520, 530 formed as a result thereof may generally be referred to herein as damascene metal lines.

The second conductive metal material 510 may be deposited using known techniques including, but not limited to, chemical vapor deposition (CVD), plasma enhanced chemical vapor deposition (PECVD), atomic layer deposition (ALD), physical vapor deposition (PVD), sputtering, chemical solution deposition plating. The second conductive metal material 510 may be a metal or metal alloy including, but not limited to, copper (Cu), aluminum (Al), ruthenium (Ru), rhodium (Rh), iridium (Ir), tungsten (W), molybdenum (Mo), nickel (Ni), or an alloy thereof, such as, for example, a Cu—Al alloy.

In some embodiments, and as depicted by FIG. 5A, the first conductive metal material 110 (used to form the first set of metal lines 120, 130, 140, and the metal line connectors 150, 160) and the second conductive metal material 510 (used to form the second set of metal lines 520, 530) are different conductive metal materials. However, in other embodiments, the first conductive metal material 110 and the second conductive metal material 510 are the same conductive metal material.

Following the deposition of the second conductive metal material 510 to fill the first set of line openings 420, 430 (depicted in FIG. 4), a planarization process such as, for example, chemical mechanical planarization or polishing (CMP), and/or grinding, may be performed to remove portions of the second conductive metal material 510 located above the top surface 122 of the first set of metal lines 120, 130, 140. The planarization stops at the top surface 122 of the first set of metal lines 120, 130, 140, such that a top surface 522 of the second set of metal lines 520, 530 is substantially coplanar with the top surface 122 of the first set of metal lines 120, 130, 140.

As depicted by FIG. 5A, the second set of metal lines 520, 530 alternate between the first set of metal lines 120, 130, 140. Metal line 520 is located above the metal line connector 150 connecting metal lines 120, 130, and runs along the same direction as metal lines 120, 130 (i.e., metal line 520 is parallel to metal lines 120, 130). A portion of the insulating material 350, referred to herein as insulating liner 540, isolates the metal line 520 from the metal lines 120, 130, and the metal line connector 150. Similarly, metal line 530 is located above the metal line connector 160 connecting metal line 130 to metal lines 140, and runs along the same direction as metal lines 130, 140 (i.e., metal line 530 is parallel to metal lines 130, 140). A portion of the insulating material 350, referred to herein as insulating liner 550, isolates the metal line 530 from the metal lines 130, 140, and the metal line connector 160.

As further depicted by FIG. 5A, the top surface 522 of the second set of the metal lines 520, 530 is substantially coplanar with the top surface 122 of the first set of metal lines 120, 130, 140, while the bottom surface 524 of the second set of metal lines 520, 530 is located above the bottom surface 124 of the first set of metal lines 120, 130, 140. Thus, it can be said that the height 25 of first set of metal lines 120, 130, 140 is greater than the height 30 of the second set of metal lines 520, 530.

It should be appreciated that embodiments of the present invention need not necessarily include a metal line connecter located between each pair of metal lines formed in the first set of metal lines. In some embodiments, two or more metal lines in the first set of metal lines may be consecutively formed without a metal line connector formed therebetween. For example, only one metal line connector (either metal line connector 150 or metal line connector 160) may be formed. This may be accomplished by etching completely through the first conductive metal material 110 located between two lines, thereby severing any connection between the lines. Thus, the number of metal line connector segments and the arrangement of the metal connector segment ultimately depends on the particular metal lines in the first set of metal lines that need to be interconnected.

Figure 5B:
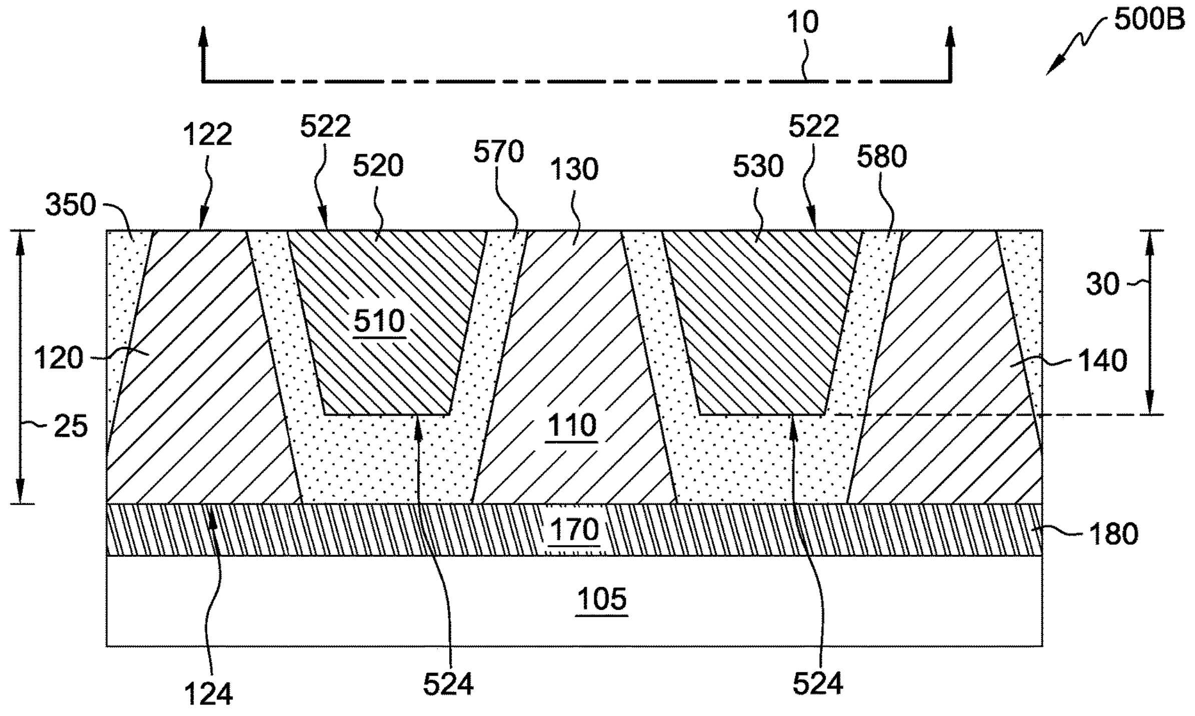
FIG. 5B illustrates a cross-sectional view, taken along corresponding line 10 of FIG. 1B, of a semicondutor interconnect structure, generally designated 500B, in accordance with at least one embodiment of the present invention.

FIG. 5B illustrates a cross-sectional view, taken along corresponding line 10 of FIG. 1B, of a semiconductor interconnect structure, generally designated 500B, in accordance with at least one embodiment of the present invention. In assembly of semiconductor interconnect structure 500B, and referring to the cross-sectional view of FIG. 5B taken along corresponding line 10 of FIG. 1, a barrier diffusion/adhesion material 170 is deposited on top of the substrate 105 prior to performing the processing steps as described above with reference to FIGS. 2-5A.

The barrier diffusion/adhesion material 170 may be deposited onto the substrate 105 using known deposition techniques including, but not limited to, chemical vapor deposition (CVD), plasma enhanced chemical vapor deposition (PECVD), atomic layer deposition (ALD), physical vapor deposition (PVD), sputtering, chemical solution deposition, or plating. The barrier diffusion/adhesion material 170 may include, but is not limited to, tantalum (Ta), tantalum nitride (TaN), titanium nitride (TiN), hafnium nitride (HfN), cobalt (Co), ruthenium (Ru), tungsten (W), tungsten nitride (WN), titanium-tungsten (TiW), tungsten nitride (WN) manganese (Mn), manganese nitride (MnN), or combinations of barrier diffusion/adhesion materials, such as RuTaN, Ta/TaN, CoWP, NiMoP, or NiMoB which are suitable for the given application.

Following the deposition of the barrier diffusion/adhesion material 170 on top of the substrate 105, the first conductive metal material 110 is deposited onto the barrier diffusion/adhesion material 170, and the structure is patterned, using subtractive etching, to form the first set of metal lines 120, 130, 140, and the metal line connector 180 located thereunder. As depicted by FIG. 5B, the metal line connector 180 is orthogonal to metal lines 120, 130, 140 at their respective points of intersection. In some embodiments, and as depicted by FIG. 5B, the first conductive metal material 110 (used to form the first set of metal lines 120, 130, 140) and the barrier diffusion/adhesion material 170 (used to form the metal line connector 180) are different conductive metal materials. However, in other embodiments, the first conductive metal material 110 and the barrier diffusion/adhesion material 170 are the same conductive metal material.

In some embodiments, the metal line connector 180 acts as a precision resistor. As used herein, the term precision resistor shall mean a high-resistivity connector between two or more metal lines in a same metal level (e.g., Mx), in which the thickness of the connector is significantly less than the run length of the connector. In some embodiments, the barrier diffusion/adhesion material 170 used to form the metal line connector 180 has a higher resistivity than the first conductive metal material 110 used to form the first set of metal lines 120, 130, 140. However, in other embodiments, the resistivity of the barrier diffusion/adhesion material 170 is less than or equal to the resistivity of the first conductive metal material 110.

Similar to the processing steps described above with respect to the formation of semiconductor interconnect structure 200 of FIG. 2, the patterning of the first conductive metal material 110 further results in the formation of respective openings (not depicted) located between metal lines 120, 130, and between metal lines 130, 140 that expose the top surface of the metal line connector 180 located below the first set of metal lines 120, 130, 140.

Next, and similar to the processing steps described above with respect to the formation of semiconductor interconnect structures 300, 400 of FIGS. 3, 4, the insulating material 350 is deposited to fill the openings (not depicted) between the first set of metal lines 120, 130, 140, and the insulating material 350 formed between the first set of metal lines 120, 130, 140 is etched to form line openings (not depicted) within the insulating material 350.

Following the formation of the line openings within the insulating material 350, and similar to the processing steps described above with respect to the formation of semiconductor interconnect structure 500A of FIG. 5, the second conductive metal material 510 is deposited to fill the line openings, followed by a planarization process. The planarization stops at the top surface 122 of the first set of metal lines 120, 130, 140, such that a top surface 522 of the second set of metal lines 520, 530 is substantially coplanar with the top surface 122 of the first set of metal lines 120, 130, 140.

In some embodiments, and as depicted by FIG. 5B, the first conductive metal material 110 (used to form the first set of metal lines 120, 130, 140, and the metal line connectors 150, 160) and the second conductive metal material 510 (used to form the second set of metal lines 520, 530) are different conductive metal materials. However, in other embodiments, the first conductive metal material 110 and the second conductive metal material 510 are the same conductive metal material.

As depicted by FIG. 5B, the second set of metal lines 520, 530 alternate between the first set of metal lines 120, 130, 140. Metal line 520 is located above the metal line connector 180 connecting metal lines 120, 130, and runs along the same direction as metal lines 120, 130 (i.e., metal line 520 is parallel to metal lines 120, 130). A portion of the insulating material 350, referred to herein as insulating liner 570, isolates the metal line 520 from the metal lines 120, 130, and the metal line connector 180. Similarly, metal line 530 is located above the metal line connector 180 connecting metal line 130 to metal lines 140, and runs along the same direction as metal lines 130, 140 (i.e., metal line 530 is parallel to metal lines 130, 140). A portion of the insulating material 350, referred to herein as insulating liner 580, isolates the metal line 530 from the metal lines 130, 140, and the metal line connector 180.

As further depicted by FIG. 5B, the top surface 522 of the second set of the metal lines 520, 530 is substantially coplanar with the top surface 122 of the first set of metal lines 120, 130, 140, while the bottom surface 524 of the second set of metal lines 520, 530 is located above the bottom surface 124 of the first set of metal lines 120, 130, 140. Thus, it can be said that the height 25 of first set of metal lines 120, 130, 140 is greater than the height 30 of the second set of metal lines 520, 530.

It should be appreciated that embodiments of the present invention need not necessarily form a metal line connector 180 that connects all of the metal lines formed in the first set of metal lines. In some embodiments, two or metal lines in the first set of metal lines may be consecutively formed without a metal line connector formed thereunder. This may be accomplished by etching completely through the barrier diffusion/adhesion layer 170 located between two metal lines, thereby severing the connection between the lines. Thus, the arrangement of the metal connector segment 180 ultimately depends on the particular metal lines in the first set of metal lines that need to be interconnected.

Figure 6:
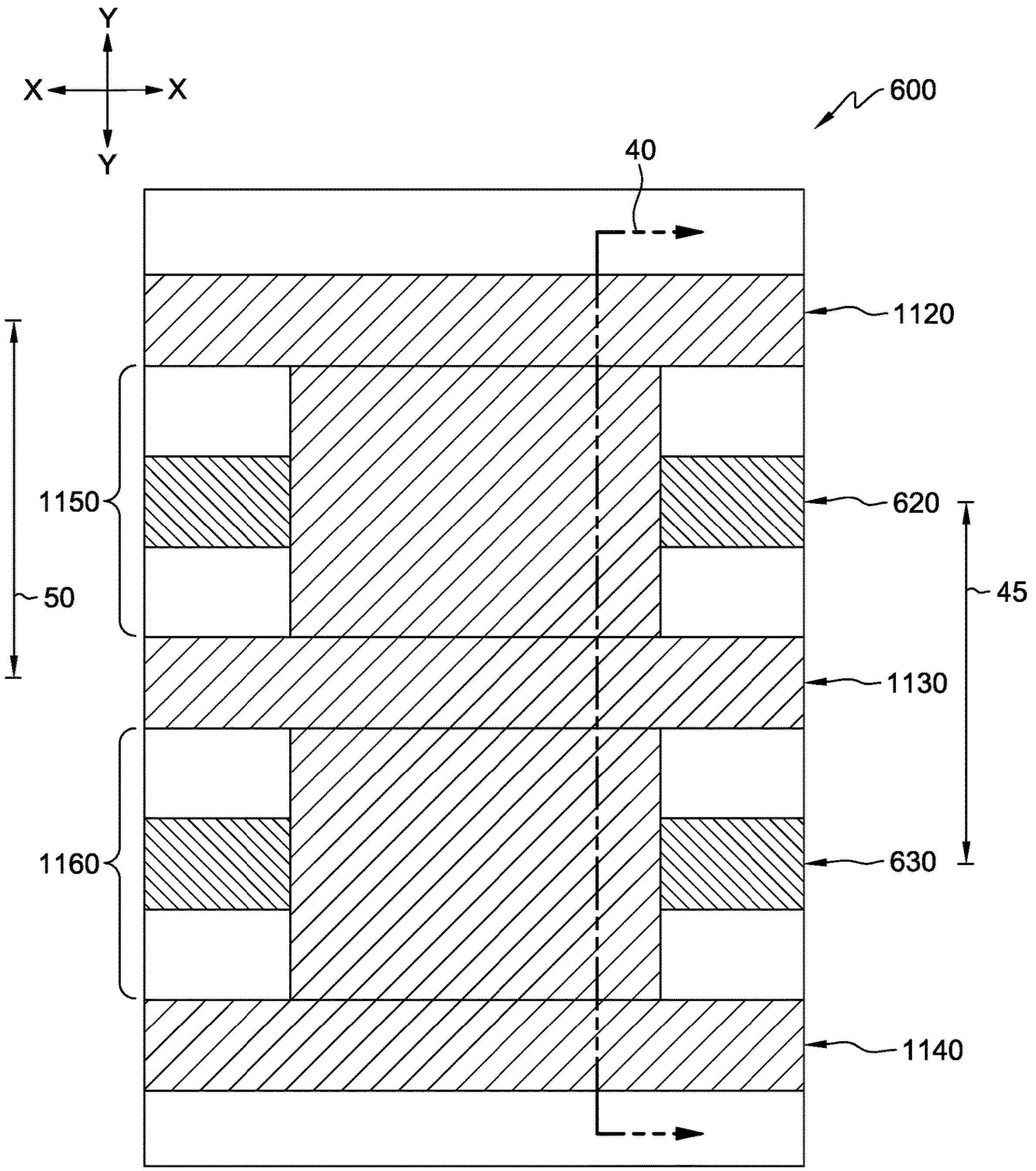
FIG. 6 illustrates a top view of a semiconductor interconnect structure, generally designated 600, in accordance with at least one embodiment of the present invention.

FIG. 6 depicts a top view of semiconductor interconnect structure 600, in accordance with at least one embodiment of the present invention. For simplicity and ease of understanding, FIG. 6 omits some elements and/or layers so as to not obscure the figure. FIG. 6 illustrates a top-down view of locations and relative orientations of a first set of metal lines (i.e., metal lines 620, 630), a second set of metal lines (i.e., metal lines 1120, 1130, 1140), and metal line connectors 1150, 1160 all formed within a same metal level (e.g., Mx). The first set of metal lines 620, 630, and the second set of metal lines 1120, 1130, 1140 run along a first orientation (i.e., along the direction of line X). The metal line connectors 1150, 1160 run along a second orientation (i.e., along the direction of line Y) that is perpendicular to the first orientation from which the first and second set of metal lines run along. It should be appreciated that the first set of metal lines and the second set of metal lines may include any number of metal lines, and embodiments of the present invention are not limited to the particular number of metal lines as depicted by FIG. 6.

As further depicted by FIG. 6, the metal lines 620, 630 of the first set of metal lines alternate with the metal lines 1120, 1130, 1140 of the second set of metal lines along the direction of line Y. However, in other embodiments, the first set of metal lines and the second set of metal lines need not necessarily alternate between one another. For example, two or more metal lines in the first set of metal lines may be consecutively formed without a metal line from the second set of metal lines formed therebetween. Similarly, two or more metal lines in the second set of metal lines may be consecutively formed without a metal line from the first set of metal lines formed therebetween. In some embodiments, and as depicted by FIG. 6, the first set of metal lines 620, 630 are formed using a subtractive manufacturing process (e.g., subtractive etching), while the second set of metal lines 1120, 1130, 1140 are formed using an additive manufacturing process (e.g., a damascene process). In some embodiments, and as depicted by FIG. 6, a first pitch 45 (i.e., the minimum center-to-center distance) between respective metal lines 620, 630 in the first set of metal lines is equal to a second pitch 50 between respective metal lines 1120, 1130, 1140 in the second set of metal lines. However, in other embodiments, the pitch between respective metal lines 620, 630 in the first set of metal lines may be less than, or greater than, the pitch between respective metal lines 1120, 1130, 1140 in the second set of metal lines.

As further depicted by FIG. 6, the metal line connector 1150 is located above metal line 620 of the first set of metal lines, and is orthogonal to metal lines 1120, 1130 of the second set of metal lines. Similarly, the metal line connector 1160 is located above metal line 630 of the first set of metal lines, and is orthogonal to metal lines 1130, 1140 of the second set of metal lines. Thus, it can be said that the metal line connector 1150 is perpendicular to metal lines 620, 630 at their respective points of intersection, and that the metal line connector 1160 is perpendicular to metal lines 1130, 1140 at their respective points of intersection. It should be appreciated that embodiments of the present invention need not necessarily include a metal line connecter located between each pair of metal lines formed in the second set of metal lines. In some embodiments, two or more metal lines in the second set of metal lines may be consecutively formed without a metal line connector formed therebetween. Thus, the number of metal line connector segments and the arrangement of the metal connector segment ultimately depends on the particular metal lines in the second set of metal lines that need to be interconnected.

The metal line connectors 1150, 1160 advantageously allow for routing of signals and/or power between metal lines in the same metal level. For example, metal line connector 1150 can allow signals and/or power to be routed between metal line 1120 and metal line 1130 along the direction of line Y. Similarly, metal line connector 1160 can allow signals and/or power to be routed between metal line 1130 and metal line 1140 along the direction of line Y. Accordingly, signals and/or power can ultimately be routed between multiple metal lines formed in the same metal level, as well as along the individual metal lines themselves.

Figure 7:
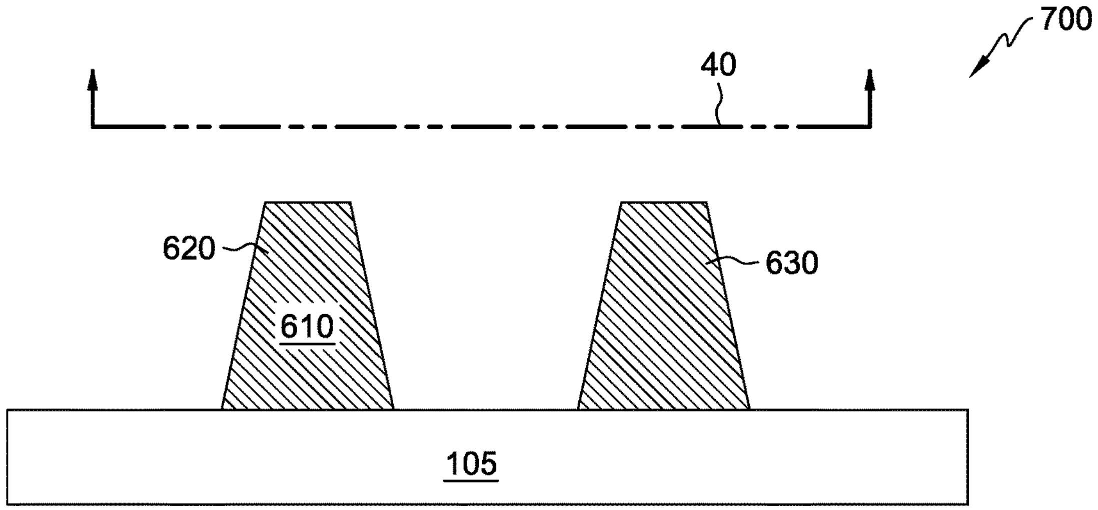
FIG. 7 illustrates a cross-sectional view, taken along corresponding line 40 of FIG. 6, of an initial semiconductor interconnect structure, generally designated 700, in accordance with at least one embodiment of the present invention.

FIGS. 7-11 illustrate a process flow of forming the semiconductor interconnect structure 600 of FIG. 6. FIG. 7 illustrates a cross-sectional view, taken along corresponding line 20 of FIG. 6, of an initial semiconductor structure, generally designated 700, in accordance with at least one embodiment of the present invention. In assembly of semiconductor structure 700, and referring to the cross-sectional view of FIG. 7 taken along corresponding line 40 of FIG. 6, a first conductive metal material 610 is initially deposited onto substrate 105, and patterned (e.g., using subtractive etching) to form the first set of metal lines 620, 630. The patterning of the first conductive metal material 610 to form the first set of metal lines 620, 630 may generally be referred to herein as a subtractive manufacturing process, and the first set of metal lines 620, 630 formed as a result thereof may generally be referred to herein as subtractively etched metal lines.

The first conductive metal material 610 may be deposited onto the substrate 105 using known deposition techniques including, but not limited to, chemical vapor deposition (CVD), plasma enhanced chemical vapor deposition (PECVD), atomic layer deposition (ALD), physical vapor deposition (PVD), sputtering, chemical solution deposition, or plating. The first conductive metal material 110 may be a metal or metal alloy including, but not limited to, copper (Cu), aluminum (Al), ruthenium (Ru), rhodium (Rh), iridium (Ir), tungsten (W), molybdenum (Mo), nickel (Ni), or an alloy thereof, such as, for example, a Cu—Al alloy.

Following the deposition of the first conductive metal material 610 onto the substrate 105, the first conductive metal material is patterned using a subtractive manufacturing process. For example, a hard mask material (e.g., silicon nitride, titanium nitride, tantalum nitride, or any suitable inorganic metal-containing material) is deposited (e.g., utilizing known techniques including, but not limited to, chemical vapor deposition (CVD), plasma enhanced chemical vapor deposition (PECVD), atomic layer deposition (ALD), physical vapor deposition (PVD), or sputtering) onto the first conductive metal material 610, and the hard mask material is patterned to form a patterned hard mask (not depicted). Then, using the patterned hard mask, the first conductive metal material 610 is etched (using, for example, reactive ion etching (RIE), ion beam etching (IBE), chemical wet etching, or a combination of IBE and chemical wet etching) to form the first set of metal lines 620, 630.

Figure 8:
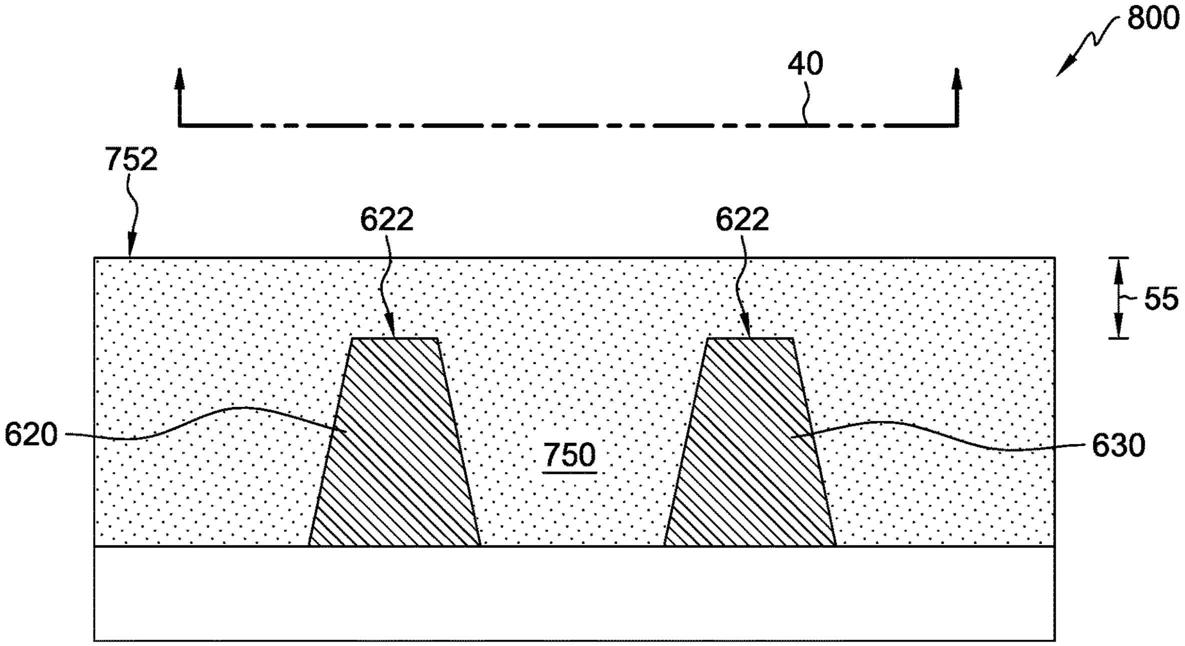
FIG. 8 illustrates a cross-sectional view, taken along corresponding line 40 of FIG. 6, of semiconductor interconnect structure 700 depicted in FIG. 7 after performing subsequent processing steps, generally designated 800, in accordance with at least one embodiment of the present invention.

FIG. 8 illustrates a cross-sectional view of semiconductor interconnect structure 700 depicted in FIG. 7 after performing subsequent processing steps, generally designated as semiconductor interconnect structure 800, in accordance with at least one embodiment of the present invention. In assembly of semiconductor interconnect structure 800, and referring to the cross-sectional view of FIG. 8 taken along corresponding line 40 of FIG. 6, an insulating material 750 is deposited onto the patterned first conductive metal material 610, followed by a planarization process.

The insulating material 750 may be deposited, using known techniques including, but not limited to, chemical vapor deposition (CVD), plasma enhanced chemical vapor deposition (PECVD), atomic layer deposition (ALD), physical vapor deposition (PVD), sputtering, or chemical solution deposition. The insulating material 750 may be formed from any of the insulating materials as previously described above with respect to insulating material 350. Following the deposition of the insulating material 750, a planarization process such as, for example, chemical mechanical planarization or polishing (CMP), and/or grinding, may subsequently be performed to form a uniform, flat surface with respect to the insulating material 750.

As depicted by FIG. 8, the insulating material 750 encapsulates the first set of metal lines 620, 630, such that the top surface 752 of the insulating material 750 is located above the top surface 622 of the first set of metal lines 620, 630. This is done in order to allow for the subsequent formation of the metal line connectors 1150, 1160 (depicted in FIG. 11) above the metal lines 620, 630 using a damascene process as described in further detail below. Thus, the difference in height 55 between the top surface 622 of the metal lines 620, 630 and the top surface 752 of the insulting material 750 must be sufficient to be able to form the metal line connectors 1150, 1160 above the metal lines 620, 630, while also retaining a portion of the insulating material 750 between the metal line connectors 1150, 1160 and the metal lines 620, 630.

Figure 9:
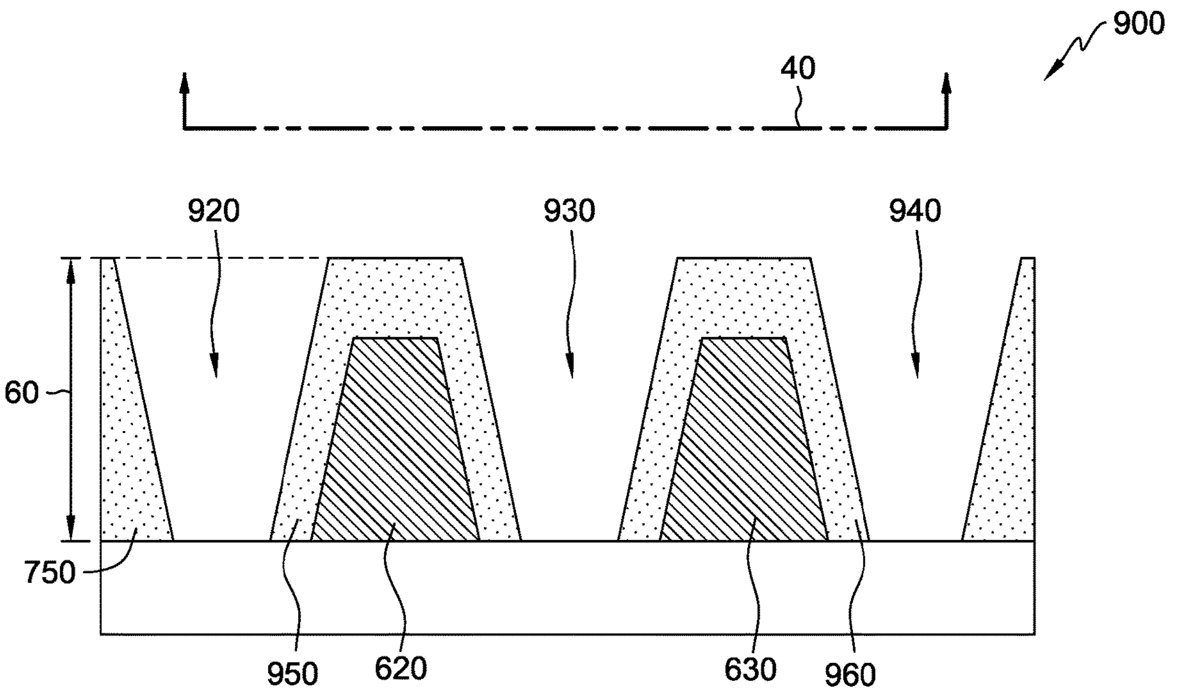
FIG. 9 illustrates a cross-sectional view, taken along corresponding line 40 of FIG. 6, of semiconductor interconnect structure 800 depicted in FIG. 8 after performing subsequent processing steps, generally designated 900, in accordance with at least one embodiment of the present invention.

FIG. 9 illustrates a cross-sectional view of semiconductor interconnect structure 800 depicted in FIG. 8 after performing subsequent processing steps, generally designated as semiconductor interconnect structure 900, in accordance with at least one embodiment of the present invention. In assembly of semiconductor interconnect structure 900, and referring to the cross-sectional view of FIG. 9 taken along corresponding line 40 of FIG. 6, a first set of line openings 920, 930, 940 are formed within the insulating material 750.

The first set of line openings 920, 930, 940 may be formed as follows. A hard mask material (e.g., silicon nitride, titanium nitride, tantalum nitride, or any suitable inorganic metal-containing material) is deposited (e.g., utilizing known techniques including, but not limited to, chemical vapor deposition (CVD), plasma enhanced chemical vapor deposition (PECVD), atomic layer deposition (ALD), physical vapor deposition (PVD), or sputtering) onto the insulating material 750, and patterned to form a patterned hard mask (not depicted). Then, using the patterned hard mask, the insulating material 750 is etched (using, for example, reactive ion etching (RIE), ion beam etching (IBE), chemical wet etching, or a combination of IBE and chemical wet etching) to form the first set of line openings 920, 930, 940 within the insulating material 750.

In some embodiments, after forming the first set of line openings 920, 930, 940, an optional metal barrier material is conformally deposited on the exposed surfaces of the first line openings 920, 930, 940 to form a barrier layer (not depicted). The barrier layer may be formed using any of the materials and processes as previously described above with respect to the optional barrier layer formed within the first set of line openings 220, 230.

As depicted by FIG. 9, line opening 920 is located adjacent to metal line 620, line opening 930 is located between metal lines 620, 630, and line opening 940 is located adjacent to metal line 630. In other words, the line openings 920, 930, 940 alternate between the first set of metal lines 620, 630. The line openings 920, 930, 940 run along the same direction as the first set of metal lines 620, 630 (i.e., line openings 920, 930, 940 are parallel to metal lines 620, 630).

As further depicted by FIG. 9, the formation of the line openings 920, 930 within the insulating material 750 results in the metal line 620 being lined by a portion of the insulating material 750, referred to herein as insulating liner 950. Similarly, the formation of the line openings 930, 940 within the insulating material 750 results in the metal line 630 being lined by a portion of the insulating material 750, referred to herein as insulating liner 960.

Figure 10:
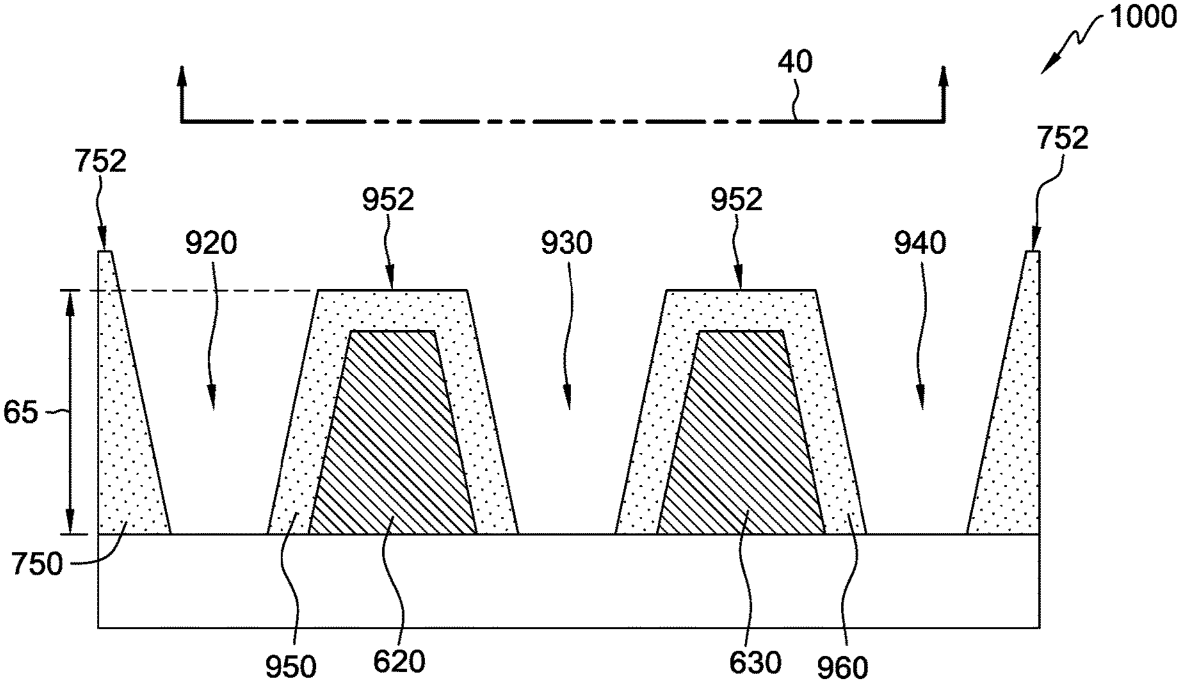
FIG. 10 illustrates a cross-sectional view, taken along corresponding line 40 of FIG. 6, of semiconductor interconnect structure 900 of FIG. 9 after performing subsequent processing steps, generally designated 1000, in accordance with at least one embodiment of the present invention.

FIG. 10 illustrates a cross-sectional view of semiconductor interconnect structure 900 depicted in FIG. 9 after performing subsequent processing steps, generally designated as semiconductor interconnect structure 1000, in accordance with at least one embodiment of the present invention. In assembly of semiconductor interconnect structure 1000, and referring to the cross-sectional view of FIG. 10 taken along corresponding line 40 of FIG. 6, the height of the insulating liners 950, 960 is reduced from a first height 60 (depicted in FIG. 9) to a second height 65. As a result, the top surface 952 of the insulating liners 950, 960 is located below the top surface 752 of the insulating material 750 located adjacent to line openings 920, 940.

Reducing the height of the insulating liners 950, 960 may be performed as follows. A hard mask material (e.g., silicon nitride, titanium nitride, tantalum nitride, or any suitable inorganic metal-containing material) is deposited (e.g., utilizing known techniques including, but not limited to, chemical vapor deposition (CVD), plasma enhanced chemical vapor deposition (PECVD), atomic layer deposition (ALD), physical vapor deposition (PVD), or sputtering) and patterned to form a patterned hard mask (not depicted). Then, using the patterned hard mask, the top surface of the insulating liners 950, 960 is etched (using, for example, reactive ion etching (RIE), ion beam etching (IBE), chemical wet etching, or a combination of IBE and chemical wet etching) to reduce the height of the insulating liners 950, 960 from the first height 60 (depicted in FIG. 9) to the second height 65.

Figure 11:
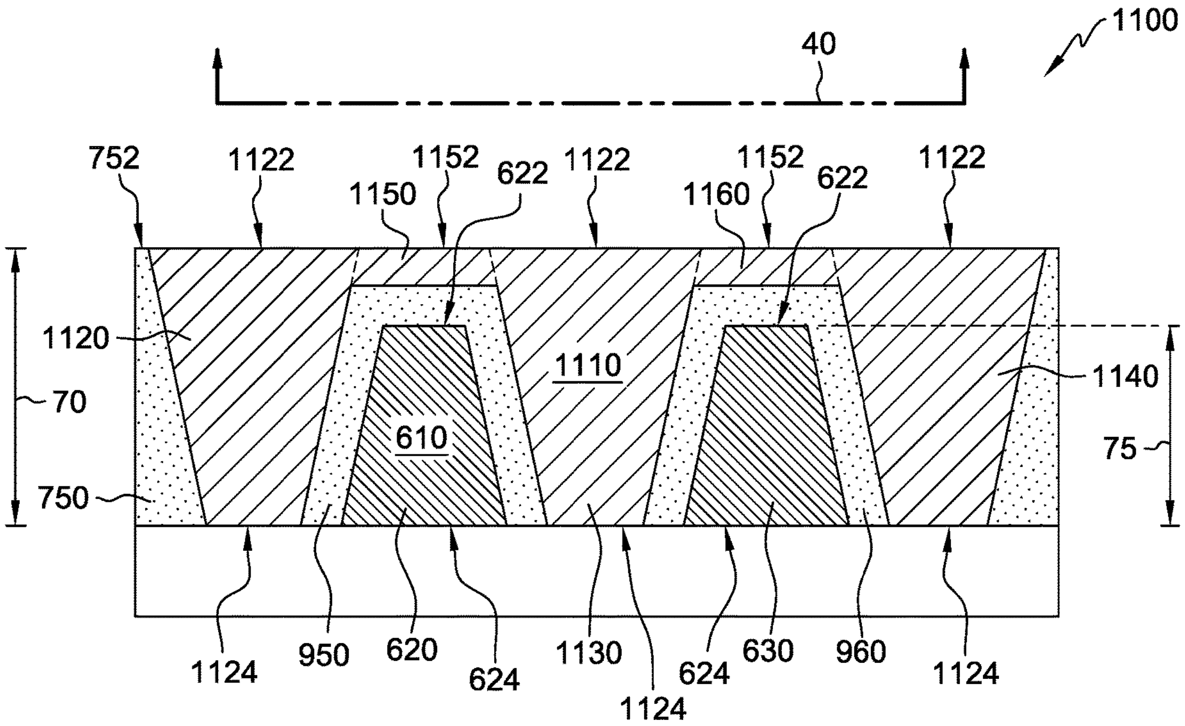
FIG. 11 illustrates a cross-sectional view, taken along corresponding line 40 of FIG. 6, of semiconductor interconnect structure 1000 of FIG. 10 after performing subsequent processing steps, generally designated 1100, in accordance with at least one embodiment of the present invention.

FIG. 11 illustrates a cross-sectional view of semiconductor interconnect structure 1000 depicted in FIG. 10 after performing subsequent processing steps, generally designated 1100, in accordance with at least one embodiment of the present invention. In assembly of semiconductor interconnect structure 1100, and referring to the cross-sectional view of FIG. 11 taken along corresponding line 40 of FIG. 6, a second conductive metal material 1110 is deposited within the line openings 920, 930, 940 (depicted in FIG. 10) and onto the top surface 952 of the insulating liners 950, 960, followed by a planarization process. The second conductive metal material 1110 deposited within the first set of line openings 920, 930, 940 results in the formation of the second set of metal lines 1120, 1130, 1140, while the second conductive metal material 1110 deposited onto the top surface 952 of the insulating liners 950, 960 results in the formation of the metal line connectors 1150, 1160. The deposition of the second conductive metal material 1110 to form the second set of metal lines 1120, 1130, 1140, and the metal line connectors 1150, 1160 may generally be referred to herein as an additive manufacturing process, and the second set of metal lines 1120, 1130, 1140, and the metal line connectors 1150, 1160 formed as a result thereof may generally be referred to herein as damascene metal lines and damascene metal line connectors, respectively.

The second conductive metal material 1110 may be deposited using known techniques including, but not limited to, chemical vapor deposition (CVD), plasma enhanced chemical vapor deposition (PECVD), atomic layer deposition (ALD), physical vapor deposition (PVD), sputtering, chemical solution deposition plating. The second conductive metal 1110 may be a metal or metal alloy including, but not limited to, copper (Cu), aluminum (Al), ruthenium (Ru), rhodium (Rh), iridium (Ir), tungsten (W), molybdenum (Mo), nickel (Ni), or an alloy thereof, such as, for example, a Cu—Al alloy.

In some embodiments, and as depicted by FIG. 11, the first conductive metal material 610 (used to form the first set of metal lines 620, 630) and the second conductive metal material 1110 (used to form the second set of metal lines 1120, 1130, 1140, and the metal line connectors 1150, 1160) are different conductive metal materials. However, in other embodiments, the first conductive metal material 610 and the second conductive metal material 1110 are the same conductive metal material.

Following the deposition of the second conductive metal material 1110, a planarization process such as, for example, chemical mechanical planarization or polishing (CMP), and/or grinding, may be performed to remove portions of the second conductive metal material 1110 located above the top surface 752 of the insulating material 750. The planarization stops at the top surface 752 of the insulating material 750, such that the top surface 1122 of the second set of metal lines 1120, 1130, 1140, and the top surface of the 1152 of the metal line connectors 1150, 1160 are substantially coplanar with the top surface 752 of the insulating material 750.

As depicted by FIG. 11, the second set of metal lines 1120, 1130, 1140 alternate between the first set of metal lines 620, 630. Metal line 1120 is located adjacent to metal line 620, metal line 1130 is located between metal lines 620, 630, and metal line 1140 is located adjacent to metal line 620. Metal lines 1120, 1130, 1140 run along the same direction as metal lines 620, 630 (i.e., metal lines 1120, 1130, 1140 are parallel to metal lines 620, 630). The top surface 1122 of the second set of metal lines 1120, 1130, 1140 is located above the top surface 622 of the first set of metal lines 620, 630, while the bottom surface 1124 of the second set of metal lines 1120, 1130, 1140 is substantially coplanar with the bottom surface 624 of the first set of metal lines 620, 630. Thus, it can be said that the height 70 of the second set of metal lines 1120, 1130, 1140 is greater than the height 75 of the first set of metal lines 620, 630.

The metal line connector 1150 is located above metal line 610, and is orthogonal to metal lines 1120, 1130 at their respective points of intersection. The insulating liner 950 isolates the metal line 610 from the metal lines 1120, 1130, and the metal line connector 1150 connecting metal line 1120 to metal line 1130. Similarly, the metal line connector 1160 is located above metal line 620, and is orthogonal to metal lines 1130, 1140 at their respective points of intersection. The insulating liner 960 isolates the metal line 620 from the metal lines 1130, 1140, and the metal line connector 1160 connecting metal line 1130 to metal line 1140.

It should be appreciated that embodiments of the present invention need not necessarily include a metal line connecter located between each pair of metal lines formed in the second set of metal lines. In some embodiments, two or more metal lines in the second set of metal lines may be consecutively formed without a metal line connector formed therebetween. For example, only one metal line connector (either metal line connector 1150 or metal line connector 1160) may be formed. This may be accomplished by not recessing the insulating liner (e.g., insulating liner 950 or insulating liner 960) prior to depositing the second conductive metal material 1110, thereby insulating the lines from one another. Thus, the number of metal line connector segments and the arrangement of the metal connector segments ultimately depends on the particular metal lines in the second set of metal lines that need to be interconnected.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A semiconductor interconnect structure, comprising:

a first metal line, a second metal line, and a third metal line running along a first orientation within a metal level, wherein the second metal line is located between the first and third metal lines; and a metal line connector running along a second orientation within the metal level, wherein the metal line connector is located below the second metal line, and connected to the first and third metal lines.

2. The semiconductor interconnect structure of claim 1, further comprising:

an insulating material that isolates the second metal line from the first metal line, the third metal line, and the metal line connector.

3. The semiconductor interconnect structure of claim 1, wherein the second orientation is orthogonal to the first orientation.

4. The semiconductor interconnect structure of claim 1, wherein:

the first metal line, the third metal line, and the metal line connector are formed using a subtractive manufacturing process; and the second metal line is formed using an additive manufacturing process.

5. The semiconductor interconnect structure of claim 1, wherein:

the first metal line and the third metal line are subtractively etched metal lines; and the second metal line is a damascene metal line.

6. The semiconductor interconnect structure of claim 1, wherein:

a bottom surface of the metal line connector is substantially coplanar with a bottom surface of the first and third metal lines; and a top surface of the metal line connector is located below a top surface of the first and third metal lines.

7. The semiconductor interconnect structure of claim 1, wherein:

a top surface of the second metal line is substantially coplanar with a top surface of the first and third metal lines; and a bottom surface of the second metal line is located above a top surface of the metal line connector.

8. The semiconductor interconnect structure of claim 1, wherein a first height of the first and third metal lines is greater than a second height of the second metal line.

9. A semiconductor interconnect structure, comprising:

a first metal line, a second metal line, and a third metal line running along a first orientation within a metal level, wherein the second metal line is located between the first and third metal lines; and a metal line connector running along a second orientation within the metal level, wherein the metal line connector is located above the second metal line, and connected to the first and third metal lines.

10. The semiconductor interconnect structure of claim 9, further comprising:

an insulating material that isolates the second metal line from the first metal line, the third metal line, and the metal line connector.

11. The semiconductor interconnect structure of claim 9, wherein the second orientation is orthogonal to the first orientation.

12. The semiconductor interconnect structure of claim 9, wherein:

the first metal line, the third metal line, and the metal line connector are formed using an additive manufacturing process; and the second metal line is formed using a subtractive manufacturing process.

13. The semiconductor interconnect structure of claim 9, wherein:

the first metal line and the third metal line are damascene metal lines; and the second metal line is a subtractively etched metal line.

14. The semiconductor interconnect structure of claim 9, wherein:

a top surface of the metal line connector is substantially coplanar with a top surface of the first and third metal lines; and a bottom surface of the metal line connector is located above a bottom surface of the first and third metal lines.

15. The semiconductor interconnect structure of claim 9, wherein:

a bottom surface of the first and third metal lines is substantially coplanar with a bottom surface of the second metal line; and a top surface of the second metal line is located below a bottom surface of the metal line connector.

16. The semiconductor interconnect structure of claim 9, wherein a first height of the first and third metal lines is greater than a second height of the second metal line.

* * * * *